United States Patent [19]
Yamazaki

[11] Patent Number: 4,591,893
[45] Date of Patent: May 27, 1986

[54] PHOTOELECTRIC CONVERSION DEVICE UTILIZING FIBROUS SILICON

[75] Inventor: Shunpei Yamazaki, Tokyo, Japan

[73] Assignee: Semiconductor Energy Laboratory Co., Ltd., Japan

[21] Appl. No.: 497,702

[22] Filed: May 24, 1983

[30] Foreign Application Priority Data

May 24, 1982 [JP] Japan .................................. 57-87801

[51] Int. Cl.[4] ............................................. H01L 27/14
[52] U.S. Cl. ....................................... 357/30; 357/58; 357/2; 357/59
[58] Field of Search ............... 357/58, 59, 2, 30, 30 K, 357/59 R

[56] References Cited

U.S. PATENT DOCUMENTS

| | | |
|---|---|---|
| 4,196,438 | 4/1980 | Carlson . |
| 4,401,840 | 8/1983 | Chitre ............................... 357/59 X |
| 4,433,202 | 2/1984 | Maruyama et al. ................. 357/2 X |

FOREIGN PATENT DOCUMENTS 2083703 3/1982 United Kingdom ............. 357/30 K

OTHER PUBLICATIONS

"Amorphous Silicon Solar Cell", Carlson et al, *Applied Physics Letters*, vol. 28, No. 11, Jun. 1976, pp. 671–673.
"Passivation of Grain Boundaries in Polycrystalline Silicon", Seager et al, *Appl. Phys. Lett.*, 34(5), Mar. 1, 1979, pp. 337–340.

*Primary Examiner*—Andrew J. James
*Assistant Examiner*—William A. Mintel
*Attorney, Agent, or Firm*—Gerald J. Ferguson, Jr.

[57] ABSTRACT

A PIN type semiconductor photoelectric conversion device is provided with a non-single-crystal semiconductor laminate member which comprises a first non-single-crystal semiconductor layer of a first conductivity, an I-type second non-single-crystal semiconductor layer and a third non-single-crystal semiconductor layer of a second conductivity type, and first and second electrodes which make ohmic contact with the first and third non-single-crystal semiconductor layers, respectively. Either one or both of the first and third non-single-crystal semiconductor layers have a fibrous structure which has a smaller light absorption coefficient than do the non-single-crystal semiconductors of the amorphous and microcrystalline structures formed of the same semiconductor material. The non-single crystal semiconductor layer of the fibrous structure is formed by a chemical vapor reaction of a gas mixture of semiconductor material gas, recombination center neutralizer gas and impurity material gas in a reaction chamber in the same manner as has been employed in the manufacture of the conventional semiconductor photoelectric conversion devices. In this case, the substrate on which the non-single-crystal semiconductor layer is to be formed is disposed so that a stream of the gas mixture may be passed over the substrate, and chemical vapor reaction is carried out at a pressure of 0.001 to 10 Torr and 100° to 400° C. in the reaction chamber.

12 Claims, 20 Drawing Figures

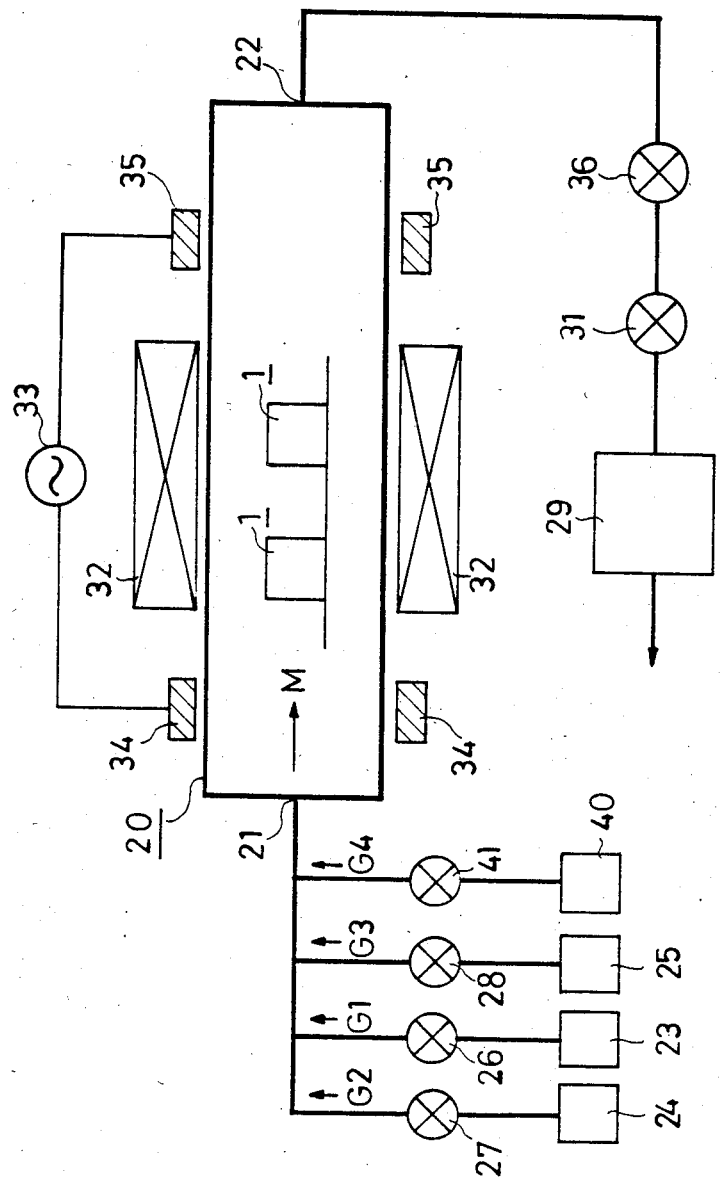

PHOTOELECTRIC CONVERSION DEVICE UTILIZING FIBROUS SILICON

BACKGROUND OF THE INVENTION

1. Field of the Invention

The present invention relates to a PIN type semiconductor photoelectric conversion device using a non-single-crystal semiconductor and a method of making the same.

2. Description of the Prior Art

Heretofore there has been proposed a PIN type semiconductor photoelectric conversion device using a non-single-crystal semiconductor.

The PIN type semiconductor photoelectric conversion device comprises a non-single-crystal semiconductor laminate member having a first non-single-crystal semiconductor layer of a first conductivity type (P or N conductivity type), an I-type non-single-crystal semiconductor layer and a third non-single-crystal semiconductor layer of a second conductivity type reverse from the first conductivity type (that is, N-type when the first non-single-crystal semiconductor layer is P-type, and P-type when the latter is N-type), and first and second electrodes making ohmic contact with the first and third non-single-crystal semiconductor layers, respectively.

When irradiated by light on the side of the first non-single-crystal semiconductor layer of the non-single-crystal semiconductor laminate member, such a PIN type semiconductor photoelectric conversion device performs a photoelectric conversion through the following mechanism.

That is to say, the incident light passes through the first non-single-crystal semiconductor layer to reach the second non-single-crystal semiconductor layer, wherein it is absorbed. In consequence, carriers (electron-holes pairs) are created in the second non-single-crystal semiconductor layer. The carriers migrate into the first and second non-single-crystal semiconductor layers and then reach the first and second electrodes. Accordingly, a current corresponding to the intensity of the incident light is supplied to a load connected across the first and second electrodes.

In the abovesaid PIN type semiconductor photoelectric conversion device, the first non-single-crystal semiconductor layer serves as a window for the light incident on the second non-single-crystal semiconductor layer. Therefore, it is desired that the first non-single-crystal semiconductor layer have a light absorption coefficient which is small.

The second non-single-crystal semiconductor layer absorbs the incident light and generates carriers. It is therefore desirable that the second non-single-crystal semiconductor layer be large in light absorption coefficient.

Moreover, the first and third non-single-crystal semiconductor layers receive the carriers created in the second non-single-crystal semiconductor layer and direct them to the first and second electrodes, respectively. For this reason, it is desirable that the first and third non-single-crystal semiconductor layers be high in electric conductivity.

There has been proposed a PIN type semiconductor photoelectric conversion device in which the first, second and third non-single-crystal semiconductor layers each have an amorphous structure.

Generally, in the case of such a PIN type semiconductor photoelectric conversion device, each non-single-crystal semiconductor layer of the amorphous structure can be formed to have a large light absorption coefficient which is close to that of a semiconductor layer having a single-crystal structure, so that it is possible that light incident on the second non-single-crystal semiconductor layer through the first non-single-crystal semiconductor layer is effectively absorbed to create carriers.

In the case where the first, second and third non-single-crystal semiconductor layers are each formed by a non-single-crystal semiconductor layer of the amorphous structure having a large light absorption coefficient, however, the first non-single-crystal semiconductor layer serving as a window for the light to be transmitted to the second non-single-crystal semiconductor layer is equipped with a large light absorption coefficient, and hence is poor in the function as the window.

When the first, second and third non-single-crystal semiconductor layers are each formed by a non-single-crystal semiconductor layer of the amorphous structure having a small light absorption coefficient, the effect of the window action of the first non-single-crystal semiconductor layer can be heightened but the efficiency of absorbing the incident light by the second non-single-crystal semiconductor layer to create carriers is low.

Furthermore, in the case of the PIN type semiconductor photoelectric conversion device in which the first, second and third non-single-crystal semiconductor layers all have the amorphous structure, the electric conductivity of each non-single-crystal semiconductor layer is usually as low as $1/10^6$ to $1/10^8$ that of the single-crystal structure, so that the carriers created in the second non-single-crystal semiconductor layer cannot quickly be delivered by the first and third non-single-crystal semiconductor layers to the first and second electrodes without loss.

Accordingly, the PIN type semiconductor photoelectric conversion device of this construction has the defects of low photoelectric conversion efficiency and poor light response characteristic.

There has also been proposed a PIN type semiconductor photoelectric conversion device in which the first, second and third non-single-crystal semiconductor layers each have a microcrystalline structure.

In the case of such a PIN type photoelectric conversion device, since the non-single-crystal semiconductor layer of the microcrystalline structure can generally be formed to have a electric conductivity higher than does the non-single-crystal semiconductor layer of the amorphous structure, the carriers generated in the second non-single-crystal semiconductor layer can be delivered by the first and third non-single-crystal semiconductor layers to the first and second electrodes with less loss and more quickly than in the case of the first, second and third non-single-crystal semiconductor layers of the amorphous structure.

However, the electric conductivity of the non-single-crystal semiconductor layer of the microcrystalline structure is as low as $1/10^2$ to $1/10^4$ that of the semiconductor layer of the single-crystal structure. On account of this, the carriers created in the second non-single-crystal semiconductor layer cannot rapidly be delivered by the first and third non-single-crystal semiconductor layers to the first and second electrodes without loss.

In general, the non-single-crystal semiconductor layer of the microcrystalline structure can be formed to have a light absorption coefficient smaller than that of the non-single-crystal semiconductor layer of the amorphous structure.

In this case, however, it is impossible to concurrently and sufficiently satisfy the requirements of absorbing incident light by the second non-single-crystal semiconductor layer with high efficiency to create carriers and quickly delivering the carriers by the first and third non-single-crystal semiconductor layers from the second non-single-crystal semiconductor layer to the first and second electrodes without loss.

Accordingly, the PIN type semiconductor photoelectric conversion device of the type that the first to third non-single-crystal semiconductor layers all have the microcrystalline structure is low in photoelectric conversion efficiency and in light response characteristic as well.

Furthermore, this PIN type semiconductor photoelectric conversion device is not easy to fabricate because high temperature is generally required for the formation of the non-single-crystal semiconductor layer of the microcrystalline structure.

In addition, whether the first to third non-single-crystal semiconductor layers have the amorphous or microcrystalline structure, the conventional PIN type semiconductor photoelectric conversion devices do not possess the construction that makes use of that portion of the light incident on the second non-single-crystal semiconductor layer through the first non-single-crystal semiconductor layer which is not absorbed by the second non-single-crystal semiconductor layer and directed to the second electrode.

Therefore, the prior art PIN type semiconductor photoelectric conversion devices have the drawback of low photoelectric conversion efficiency.

SUMMARY OF THE INVENTION

It is therefore an object of the present invention to provide a novel PIN type semiconductor photoelectric conversion device and its manufacturing method which are free from the abovesaid defects of the prior art.

The PIN type semiconductor photoelectric conversion device of the present invention comprises, as is the case with the aforementioned conventional PIN semiconductor photoelectric conversion devices, a non-single-crystal semiconductor laminate member which has a first non-single-crystal semiconductor layer of a first conductivity, an I-type second non-single-crystal semiconductor layer and a third non-single-crystal semiconductor layer of a second conductivity type, and first and second electrodes which make ohmic contact with the first and third non-single-crystal semiconductor layers, respectively.

In the PIN type photoelectric conversion device of the present invention, however, either one or both of the first and third non-single-crystal semiconductor layers have a fibrous structure which has a smaller light absorption coefficient than do the non-single-crystal semiconductors of the amorphous and microcrystalline structures formed of the same semiconductor material.

In the case where the first non-single-crystal semiconductor layer, through which light is assumed to be incident on the second non-single-crystal semiconductor layer, has the fibrous structure, since the first non-single-crystal semiconductor layer is smaller in light absorption coefficient but higher in electric conductivity than the non-single-crystal semiconductors of the amorphous and microcrystalline structures, the window effect of directing the incident light to the second non-single-crystal semiconductor layer and the effect of directing the carriers created in the second non-single-crystal semiconductor layer to the first electrode are marked as compared with such effects obtainable when the first non-single-crystal semiconductor layer has the amorphous or microcrystalline structure.

As a result, the PIN type semiconductor photoelectric conversion device of the present invention exhibits a higher photoelectric conversion efficiency than the aforementioned conventional PIN type semiconductor photoelectric conversion device.

According to the manufacturing method of the present invention, the non-single-crystal semiconductor layer of the fibrous structure is formed by a chemical vapor reaction of a gas mixture of semiconductor material gas, recombination center netralizer gas and impurity material gas in a reaction chamber in the same manner as has been employed in the manufacture of the conventional semiconductor photoelectric conversion devices. In this case, however, the substrate on which the non-single-crystal semiconductor layer is to be formed is disposed so that a stream of the gas mixture may be passed over the substrate, and the chemical vapor reaction is carried out at a pressure of 0.001 to 10 Torr and at 100° to 400° C. in the reaction chamber.

Therefore, the manufacturing method of the present invention permits easy fabrication of the PIN type semiconductor photoelectric conversion device of the present invention which exhibits a high photoelectric conversion efficiency as referred to above.

Other object, features and advantages of the present invention will become more fully apparent from the following detailed description taken in conjunction with the accompanying drawings.

BRIEF DESCRIPTION OF THE DRAWINGS

FIG. 4 is a schematic diagram illustrating, by way of example, the method and apparatus for making the non-single-crystalline semiconductor layer of the fibrous structure in the PIN type semiconductor photoelectric conversion device of the present invention;

DESCRIPTION OF THE PREFERRED EMBODIMENTS

Figure 1:
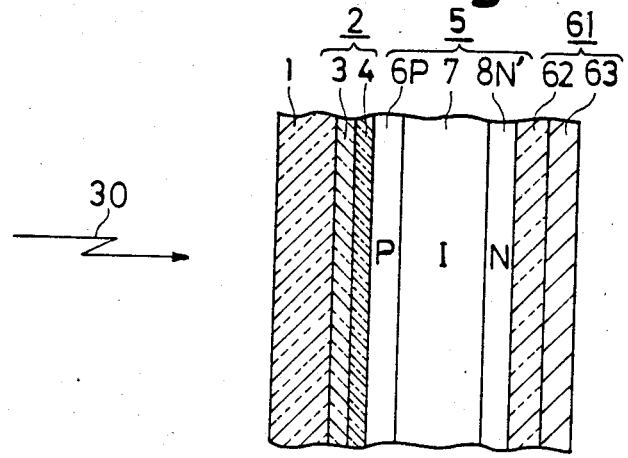
FIG. 1 is an enlarged sectional view schematically illustrating a first embodiment of the PIN type semiconductor photoelectric conversion device of the present invention.

FIG. 1 illustrates a first embodiment of the PIN semiconductor photoelectric conversion device of the present invention, which has, as a support member, light transparent insulating substrate as of glass, on which is formed a first electrode 2.

The electrode 2 is transparent to light and comprises a light transparent conductive layer 3 which is formed, for instance, of an indium oxide containing 1 to 10 wt% of a tin oxide and deposited on the light transparent insulating substrate 1 and a light transparent conductive layer 4 which is formed of a tin oxide containing 1 to 10 wt% of an antimony oxide and deposited on the light transparent conductive layer 3. The electrode 2 is, for example, 600 to 800Å thick.

On the electrode 2 is formed a non-single-crystal semiconductor laminate member 5, which has first, second and third non-single-crystal semiconductor layers 6P, 7 and 8N'.

The non-single-crystal semiconductor layer 6P is P-type and formed on the multilayer electrode 2 to a thickness, for example, of 5 to 300Å, in particular, 70 to 130Å. Furthermore, the non-single-crystal semiconductor layer 6P is formed of silicon or a semiconductor consisting principally of silicon, for example, silicon carbide expressed by $Si_xC_{1-x}(0<x<1)$ and has a fibrous structure.

Such a non-single-crystal semiconductor layer 6 is distinguished from a non-single-crystal semiconductor layer having a microcrystalline structure of the same semiconductor material.

Figure 2A:
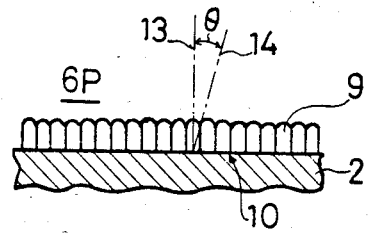
FIG. 2A is a diagram showing the constructions of a non-single-crystal semiconductor layer of a fibrous structive in the PIN type semiconductor photoelectric conversion device of the present invention depicted in FIG. 1.
Figure 3A:
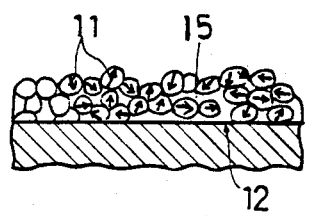
FIG. 3A and 3B are diagrams respectively showing the construction and an electronic diffraction image of a non-single-crystal semiconductor layer of a microcrystalline structure which is compared with the non-single-crystal semiconductor layer of the fibrous structure according to the present invention.

That is, the non-single-crystal semiconductor layer 6P having a fibrous structure is formed by crystals as is the case with the non-single-crystal semiconductor layer having the microcrystalline structure. In the case of the non-single-crystal semiconductor layer 6P having a fibrous structure, the crystals are grown in a direction perpendicular to a surface 10 of the electrode 2 and columnar in shape as indicated by 9 in FIG. 2A and the columnar crystals are arranged side by side in the direction parallel to the surface 10 of the electrode 2. In contrast thereto, in the case of the non-single-crystal semiconductor layer having a microcrystalline structure, non-columnar crystals 11 having a grain size of 10~100Å are piled up at random on the surface on which they are formed as shown in FIG. 3A.

When the non-single-crystal semiconductor layer 6P having the fibrous structure is formed of silicon, the crystals 9 each has a crystal plane (110) and their <110> axes extend linearly or spirally along a line 13 perpendicular to the surface 10 of the electrode 2, or a line 14 inclined at an angle $\theta$ within ±30°, in particular, ±10° to the line 13. On the other hand, when the non-single-crystal semiconductor layer having the microcrystalline structure is similarly formed of silicon, the crystals 11 each have the crystal plane (110) but their <110> axes extend at random with respect to the surface 12 as shown in FIG. 3A.

Moreover, in the non-single-crystal semiconductor layer 6P having the fibrous structure, adjacent crystals 9 are coupled together with a low degree of regularity and, consequently, there are set up substantially no grain boundary in which dangling bonds are centered between adjacent crystals 9. In contrast thereto, in the non-single-crystal semiconductor layer having the microcrystalline structure, there are formed a grain boundary 15 in which dangling bonds are centered between adjacent crystals 11.

In addition, the non-single-crystal semiconductor layer 6P having the fibrous structure is small in lattice strain as compared with the non-single-crystal semiconductor layer having the microcrystalline structure.

Figure 2B:
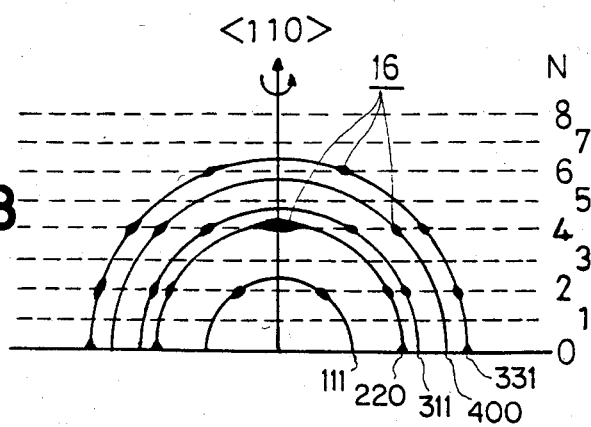
FIG. 2B is a diagram showing an electronic diffraction image of the non-single-crystal semiconductor layer of the fibrous structure in the PIN type semiconductor photoelectric conversion device of the present invention depicted in FIG. 1.
Figure 3B:
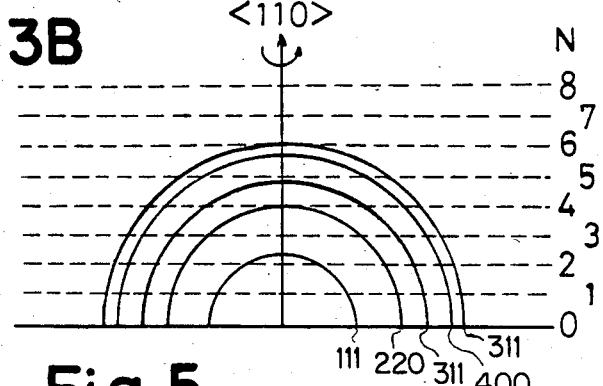

In addition, when the non-single-crystal semiconductor layer layer 6P having the fibrous structure is formed of silicon, its electronic diffraction image has many relatively wide spots 16 as shown in FIG. 2B, whereas, when the non-single-crystal semiconductor layer having the microcrystalline structure is likewise formed of silicon, its electronic diffraction image has no spots as shown in FIG. 3B. In FIGS. 2B and 3B, reference character N indicates the number of diffractions.

The non-single-crystal semiconductor layer 6P having the fibrous structure contains, as a recombination center neutralizer, hydrogen or a halogen, such as chlorine or fluorine.

The above-described non-single-crystal semiconductor layer 6p containing the recombination center neutralizer and having the fibrous structure is formed by such steps as described below.

As shown in FIG. 4, the light transparent insulating substrate 1 forming the electrode 2 is placed in a reaction chamber 20 between a gas inlet 21 and a gas outlet 22. In this case, a pair of insulating substrates 1 are assembled together in back-to-back relation and disposed in the reaction chamber 20. The insulating substrates 1 are heated by heating the interior of the reaction chamber 20 through using a heater 32 disposed therearound.

Then, semiconductor material gas identified by G1), recombination center neutralizer gas (identified by G2), such as hydrogen gas or halogen gas as of chlorine or fluorine and P-type impurity material gas (identified by G3) are introduced into the reaction chamber 20 from a semiconductor material gas source 23, a recombination center nuetralizer gas source 24 and a P-type- impurity material gas source 25 via needle valves 26, 27 and 28, respectively, and via the gas inlet 21.

On the other hand, the reaction chamber 20 is exhausted by a rotary pump 29 via the gas outlet 22, a needle valve 36 and a stop valve 31.

As a result of this, a gas mixture M of the semiconductor material gas G1, the recombination center neutralizer gas G2 and the P-type impurity material gas G3 flows in the reaction chamber 20.

Then, the gas mixture M is made to undergo a chemical vapor reaction to deposit a non-single-crystal semiconductor layer on the electrode 2 of the light transparent insulating substrate 1.

In this case, the chemical vapor reaction is carried out by applying electric energy from a power source 33 to the stream of the gas mixture M via electrodes 34 and 35 disposed around the reaction chamber 20 so that a glow or plasma discharge may be produced in the gas mixture M. It is also possible to cause the chemical vapor reaction by applying optical energy to the stream of the gas mixture M form the outside of the reaction chamber 20 in a manner to produce a glow or plasma discharge, though not shown. The chemical vapor reaction may also be effected by a combination of the electric energy from the power source 33 and the optical energy.

The method of depositing a non-single-crystal semiconductor layer on the electrode 2 of the light transparent insulating substrate 1 through utilization of the abovesaid chemical vapor reaction is commonly referred to as the plasma CVD method using either one or both of electric and optical energies.

Accordingly, the non-single-crystal semiconductor layer 6p containing the recombination center neutralizer and having the fibrous structure is formed by the plasma CVD method using either one or both of electric and optical energies as is the case with conventional non-single-crystal semiconductor layers having the microcrystalline or amorphous structure.

However, the non-single-crystal semiconductor 6P containing the recombination center neutralizer and having the fibrous structure is formed by performing the chemical vapor reaction under the following conditions different from those used in the prior art for the formation of the non-single-crystal semiconductor layers having the microcrystalline and amorphous structures, respectively.

(a) The insulating substrate 1 is positioned in the reaction chamber 20 so that a stream of the gas mixture M may be passed over the top surface of the electrode 2 formed on the insulating substrate 1;

(b) the pressure in the reaction chamber 20 is set by controlling the needle valve 36 to 0.001 to 10 Torr; and (c) the chemical vapor reaction is carried out by controlling the heater 32 at 100 to 400° C., preferably 200 to 300° C., in terms of the temperature of the insulating substrate 1 in the reaction chamber 20.

In practice, in the case where the non-single-crystal semiconductor layer formed of silicon, containing hydrogen as the recombination center neutralizer and having the fibrous structure is obtained by using, as the semiconductor material gas G1, silane gas expressed by $Si_nH_m$ ($n \geq 1, m \geq 4$), hydrogen ($H_2$) as the recombination center neutralizer gas and diborane gas ($B_2H_6$) as the P-type impurity material gas and by applying high-frequency electric energy having a frequency of 13.56 MHz to the gas mixture M for the chemical vapor reaction, the pressure in the reaction chamber 20 is selected in the range of 0.01 to 1 Torr and the temperature in the reaction chamber 20 is selected, for instance, 250° C.

Figure 5:
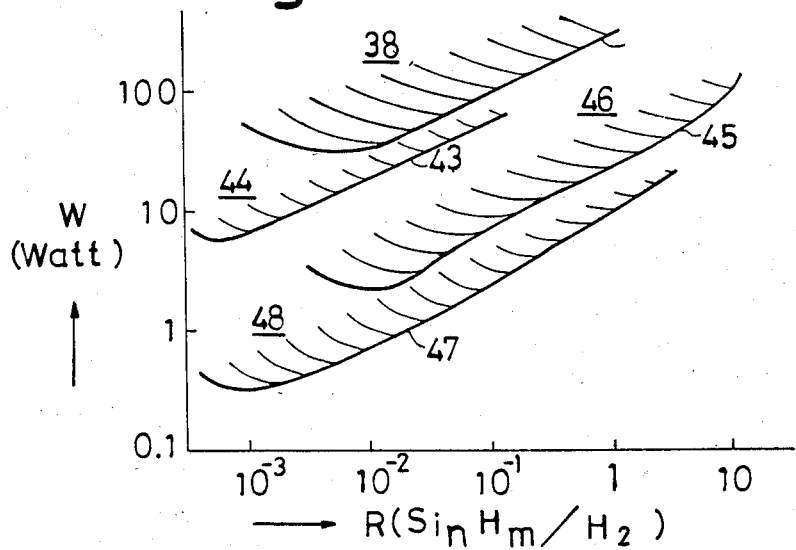
FIG. 5 is a graph showing the relationship of the ratio $R(Si_nH_m/H_2)$ between silane gas $(Si_nH_m)$ and hydrogen gas $(H_2)$ and the power W of high frequency electric energy, for explaining an embodiment of the method of making the non-single-crystal semiconductor layer of the fibrous structure in the PIN type semiconductor photoelectric conversion device of the present invention shown in FIG. 1.

In this case, for example, when the flow quantity ratio ($B_2H_6/Si_nH_m$) of the diborane ($B_2H_6$) to the silane ($Si_nH_m$) is 0.5%, it is necessary for obtaining the non-single-crystal semiconductor layer 6P formed of silicon that the flow quantity ratio R ($Si_nH_m/H_2$) of the silane ($Si_nH_m$) to the hydrogen ($H_2$) and the output W(watt) of the high-frequency electric energy bear such a relationship as indicated by the curve 37 in FIG. 5 which shows the lower limit of the output W of the high-frequency electric energy.

Accordingly, when the flow quantity ratio ($B_2H_6/Si_nH_m$) between the diborane ($B_2H_6$) and the silane ($Si_nH_m$) is 0.5%, the flow quantity ratio ($Si_nH_m/H_2$) of the silane ($Si_nH_m$) to the hydrogen ($H_2$) and the output W of the high-frequency energy are selected to assume values corresponding to respective points in a region 38 upward of the curve 37 in FIG. 5.

Furthermore, electrodes 34 and 35 for applying the high-frequency electric energy to the gas mixture M are disposed to surround the reaction chamber 20 on the side of the gas inlet 21 and the gas outlet 22, respectively, so that the electric field of the glow or plasma discharge may be substantially parallel to the top surface of the insulating substrate 1.

Incidentally, it is preferable to carry out, prior to the formation of the non-single-crystal semiconductor layer 6P, a step of removing oxygen and water remaining on the interior surface of the reaction chamber 20 and the surface of the insulating substrate 1 until the quantity of oxygen in the reaction chamber 20 is reduced down to 0.1 ppm or below, preferably, 1 to 0.01 ppm or under. This oxygen removing stop can be achieved in the following manner: At first, the reaction chamber 20 is exhausted by the pump 29 until the pressure in the chamber 20 is reduced down to about $1 \times 10^{-9}$ Torr, and hydrogen gas from the recombination center neutralizer gas source 24 is introduced into the reaction chamber 20 so that the pressure in the chamber 20 may be in the range of 0.1 to 1 Torr, and then the high-frequency electric energy is applied via the electrodes 34 and 35 to the stream of hydrogen gas to produce a plasma discharge.

In the case of forming the non-single-crystal semiconductor 6P as described previously after the abovesaid oxygen removing step, there exists, between the flow quantity ratio ($si_nH_m/H_2$) of the silane ($Si_nH_m$) to the hydrogen ($H_2$) and the output W of the high-frequency electric energy, such a lower limit region characteristic as indicated by the curve 43 in FIG. 5 which is lower than the characteristic indicated by the curve 37. On account of this, the flow quantity ratio ($Si_nH_m/H_2$) between the silane ($Si_nH_m$) and the hydrogen ($H_2$) and the output W of the high-frequency electric energy can be selected over a wider range than in the aforementioned case as shown 44 in FIG. 5, and the non-single-crystal semiconductor layer 6P can be formed to have high electric conductivity.

In this way, the non-single-crystal semiconductor layer 6P containing the recombination center neutralizer and having the fibrous structure is formed on the electrode 2.

Figure 6:
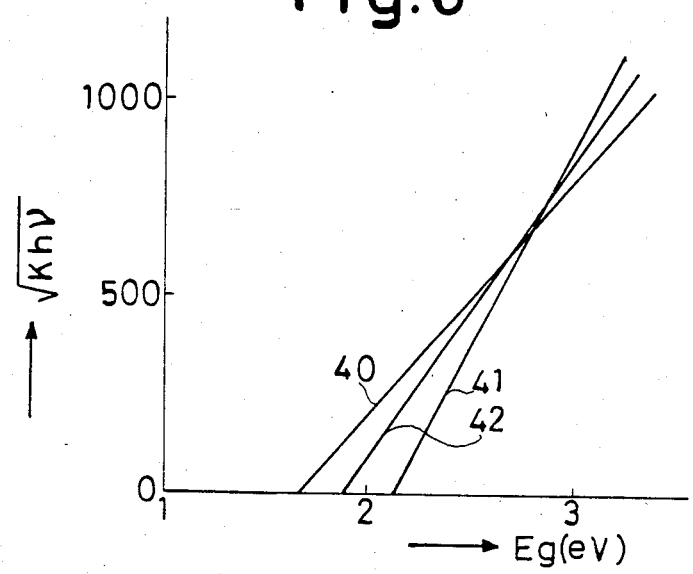
FIG. 6 is a graph showing the relationship of the light absorption coefficient, expressed by $\sqrt{khv}$, of the non-single-crystal semiconductor layer of the fibrous structure to the optical energy gap in the PIN type semiconductor photoelectric conversion device of the present invention shown in FIG. 1 in comparison with the same relation of non-single-crystal semiconductor layers of amorphous and microcrystalline structures.

In the case of the thus formed non-single-crystal semiconductor layer 6P having the fibrous structure, the optical energy gap Eg (eV) and $\sqrt{kh\nu}$ (k being the light absorption coefficient, h the Planck's constant and $\nu$ the frequency of light) bear such a relationship as indicated by the line 40 in FIG. 6. The line 40 is the results of measurement obtained in the case where the non-single-crystal semiconductor layer 6P was formed of P-type silicon containing, as an impurity, 1% of boron relative to silicon through using diborane gas. In non-single-crystal semiconductor layers having the amorphous and the microcrystalline structure, respectively, the relationship between the energy gap Eg and $\sqrt{kh\nu}$ is such as indicated by the lines 41 and 42 in FIG. 6. The lines 41 and 42 are steeper than the line 40.

Accordingly, the light absorption coefficient of the non-single-crystal semiconductor layer 6P of the fibrous structure, formed as described above, is lower than the light absorption coefficients of the non-single-crystal semiconductor layers of the microcrystalline and the amorphous structure formed of the same semiconductor material.

Figure 7:
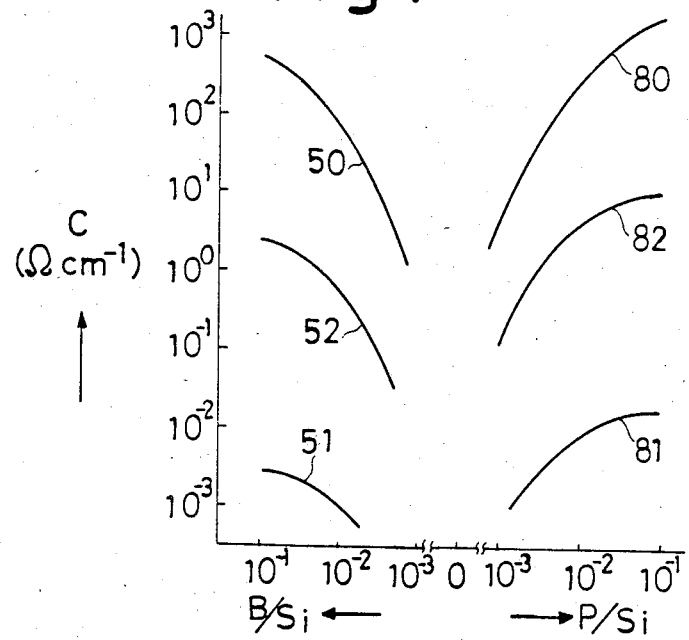
FIG. 7 is a graph showing the relationships of the electric conductivity C of the non-single-crystal semiconductor layer of the fibrous structure to the ratio of boron (B) and silicon (Si) and the ratio of phosphorus (P) and silicon (Si) in the PIN type semiconductor photoelectric conversion device of the present invention shown in FIG. 1.

In the case where non-single-crystal semiconductor layer 6P having the fibrous structure is formed of P-type silicon containing boron (B) as an impurity as referred to previously, the relationship of electric conductivity C $(\Omega cm)^{-1}$ to the ratio (B/Si) between the silicon (Si) and the boron (B) is such as indicated by the curve 51 in FIG. 7. In the cases of the non-single-crystal semiconductor layers of the amorphous and microcrystalline structures, the abovesaid relationship is such as indicated by the curves 51 and 52 in FIG. 7, respectively.

Accordingly, the non-single-crystal semiconductor layer 6P of the fibrous structure is higher in electric conductivity than the non-single-crystal semiconductor layers of the amorphous and microcrystalline structures which are formed of the same semiconductor material.

The above is a description of the non-single-crystal semiconductor layer 6P of the fibrous structure formed on the electrode 2.

The non-single-crystal semiconductor layer 7 of the non-single-crystal semiconductor laminate member 5 is I-type and formed, for example, 0.4 to 0.7 $\mu$ thick on the non-single-crystal semiconductor layer 6P of the fibrous structure.

The non-single-crystal semiconductor layer 7 contains, as the recombination center neutralizer, hydrogen or a halogen, such as chlorine, fluorine and the like, as is the case with the non-single-crystal semiconductor layer 6P, but the layer 7 has the microcrystalline or amorphous structure. The amorphous structure herein mentioned includes a semi-amorphous structure which is intermadiate between the microcrystalline and amorphous structures.

The non-single-crystal semiconductor layer 7 is formed by the known plasma CVD method using either one or both of electric and optical energies.

The non-single-crystal semiconductor layer 8N' of the non-single-crystal semiconductor laminate member 5 is N-type and formed, for instance, 100 to 300Å thick on the non-single-crystal semiconductor layer 7. As is the case with the non-single-crystal semiconductor layer 7, the non-single-crystal semiconductor layer 8N' also contains the recombination center neutralizer and has the microcrystalline or amorphous structure. And this semiconductor layer 8N' is also formed by the known plasma CVD method using either one or both of electric and optical energies.

The above is a description of the non-single-crystal semiconductor laminate member 5 formed on the electrode 2.

An electrode 61 is formed on the non-single-crystal semiconductor layer 8N' of the non-single-crystal semiconductor laminate member 5. The electrode 61 is a reflective electrode, which comprises a light transparent conductive layer 62 on the non-single-crystal semiconductor layer 8N' and a reflective conductive layer 63 on the light transparent conductive layer 62 in order that the electrode 61 may maintain its excellent ohmic contact with the non-single-crystal semiconductor layer 8N' and a high degree of reflectivity.

The light transparent conductive layer 62 of the electrode 61 is formed of a metal oxide. In the case where the non-single-crystal semiconductor layer 8N' contains phosphorus and is N-type, the abovesaid metal oxide is one that consists principally of indium oxide, such, for example, an indium oxide singly or indium oxide containing 1 to 10% of an antimony oxide.

The reflective electrode 63 of the electrode 61 is formed of metal, which is, for instance, aluminum (Al) or silver (Ag) when the metal oxide of the light transparent conductive layer 62 consists indium oxide or principally of the indium oxide.

The above is a description of the arrangement of the first embodiment of the PIN type semiconductor photoelectric conversion device of the present invention.

The first embodiment of the PIN type semiconductor photoelectric conversion device of the present invention is provided with the non-single-crystal semiconductor laminate member 5, the light transparent electrode 2 and the reflective electrode 61, and is supported on the light transparent insulating substrate 1.

The non-single-crystal semiconductor laminate member 5 comprises the P-type non-single-crystal semiconductor layer 6P, the I-type non-single-crystal semiconductor layer 7 and the N-type non-single-crystal semiconductor layer 8N' laminated in this order and, consequently, the non-single-crystal semiconductor laminate member 5 has formed therein a PIN junction.

The light transparent electrode 2 and the reflective electrode 61 make ohmic contact with the non-single-crystal semiconductor layers 6P and 8N' of the non-single-crystal semiconductor laminate member 5, respectively. The light transparent electrode 2 is desposed on the side of the light transparent insulating substrate 1.

With such an arrangement, light 30 incident on this PIN type semiconductor photoelectric conversion device from the outside of the light transparent insulating substrate 1 enters into the non-single-crystal semiconductor laminate member 5 through the light transparent insulating substrate 1 and the light transparent electrode 2. The light having thus entered into the non-single-crystal semiconductor laminate member 5 passes through the non-single-crystal semiconductor layer 6P to reach the I-type non-single-crystal semiconductor layer 7, wherein it is absorbed.

This creates in the I-type non-single-crystal semiconductor layer 7 carriers (electron-hole pairs) corresponding to the incident light. The holes and electrons migrate into the P-type non-single-crystal semiconductor layer 6P and N-type non-single-crystal semiconductor layer 8N', respectively, from which they flow into the electrodes 2 and 61.

As a result of this, a potential difference develops between the electrodes 2 and 61, so that if a load is connected between the electrodes 2 and 61, then a current corresponding to the intensity of light 30 can be supplied to the load.

In this case, if a bias source is connected across the electrodes 2 and 61 in such a manner that the PIN junction may be reversely biased and if a thick depletion layer is formed in the I-type non-single-crystalline semiconductor layer 7, the holes and electrons in the carriers can effectively be drifted by a drift electric field of the depletion layer towards the non-single-crystal semiconductor layers 6P and 8N', respectively. Thus, a multiplied current can be supplied to the load.

According to the PIN type semiconductor photoelectric conversion device of the present invention shown in FIG. 1, the non-single-crystal semiconductor layer 6P on the side of incidence of the light 30, which forms the non-single-crystal semiconductor laminate member 5, contains the recombinations center neutralizer and the fibrous structure. Such a non-single-crystal semiconductor layer 6P has a light absorption coefficient far swaller than that of the non-single-crystal semiconductor layer formed of the same semiconductor material, containing the recombination center neutralizer and having the microcrystalline or amorphous structure as described previously in connection with FIG. 6.

Therefore, loss of the light 30 by its propagation to the non-single-crystal semiconductor layer 7 through the non-single-crystal semiconductor layer 6P is far smaller than in the case where the non-single-crystal semiconductor layer 6P has the microcrystalline or amorphous structure (corresponding to the non-single-crystal semiconductor layer in the conuentional PIN type semiconductor photoelectric conversion device). Accordingly, the window effect of the non-single-crystal semiconductor layer 6P serving as a window for light is high.

Besides, the non-single-crystal semiconductor layer 6P containing the recombination center neutralizer and having the fibrous structure has far higher electric conductivity than the non-single-crystal semiconductor layer formed of the same semiconductor material, containing the recombination center neutralizer and having the microcrystalline or amorphous structure as described previously in respect of FIG. 7.

Owing to such high electric conductivity, holes in the carriers generated in the non-single-crystal semiconductor layer 7 migrate into the non-single-crystal semiconductor layer 6P and thence to the electrode 2 at higher speed and with far smaller loss than in the case where the non-single-crystal semiconductor layer 6P has the microcrystalline or amorphous structure (corresponding to the non-single-crystal semiconductor layer in the conventional PIN type semiconductor photoelectric conversion device).

According to the PIN type semiconductor photoelectric conversion device of the present invention illustrated in FIG. 1, the electrode 61 on the opposite side from the side of incidence of the light 30 is a reflective electrode.

With the provision of the reflective electrode 61, that portion of light reaching the non-single-crystal semiconductor layer 7 which is not absorbed by the non-single-crystal semiconductor layer 7 but instead passes through the non-single-crystal semiconductor layer 8N' towards the electrode 61 is reflected by the electrode 61 back to the non-single-crystal semiconductor layer 8N' to enter into the non-single-crystal semiconductor layer 7, wherein the reflected light is absorbed.

The reflective electrode 61 is comprised of a light transparent conductive electrode 62 deposited on the non-single-crystal semiconductor layer 8N' and a reflective conductive layer 63 on the light transparent conductive layer 62.

The light transparent conductive layer 62 is formed of indium oxide or metal oxide consisting principally of indium oxide when the N-type impurity contained in the non-single-crystal semiconductor layer 8N' is phosphorus. In this case, the reflective conductive layer 63 is formed of aluminum or silver.

Accordingly, the light transparent conductive layer 62 makes excellent ohmic contact with the non-single-crystal semiconductor layer 8N' and the reflective conductive layer 63. The reflective conductive layer 63 is formed of aluminum or silver, and hence has a large reflection coefficient.

Accordingly, the PIN type semiconductor photoelectric conversion device of the present invention, shown in FIG. 1, exhibits a markedly high photoelectric conversion efficiency and excellent light response characteristic as compared with those in the case where the non-single-crystal semiconductor layer 6P has the microcrystalline or amorphous structure and the electrode 61 is not the reflective one.

By the way, in the case where the non-single-crystal semiconductor layers 7 and 8N' was formed of silicon and the P-type non-single-crystal semiconductor layer 6P was formed of $Si_xC_{1-x}$ having an energy gap of 1.92 to 2.1 eV, the non-single crystal semiconductor layer 6P exhibited an electric conductivity of 10 to 200 $(\Omega cm)^{-1}$ and, under the condition of AMI (100 mW/cm$^2$), photoelectric conversion efficiencies of 8 to 9% were obtained at voltages of 0.90 to 0.92 V. In contrast thereto, when the same construction as mentioned above was used except that the non-single-crystal semiconductor layer 6P was formed to have the microcrystalline or amorphous structure, the photoelectric conversion efficiency was only 7.5 to 8.5% at a voltage of 0.85 V.

According to the PIN type semiconductor photoelectric conversion device of the present invention, shown in FIG. 1, when the non-single-crystal semiconductor layer 7 is formed of silicon, if the energy gap of the non-single-crystal semiconductor layer 6P is made larger than the energy gap of the non-single-crystal semiconductor layer 7 by forming the P-type non-single-crystal semiconductor layer 6P of silicon carbide expressed by $Si_xC_{1-x}$ ($0<x<1$), then the window effect of the P-type non-crystalline semiconductor layer 6P serving as a window for light incident on the I-type non-single-crystal semiconductor conductor layer 7 is heightened for long-wavelength light, too, improving the photoelectric conversion efficiency and response characteristic.

The PIN type photoelectric conversion device of the present invention, shown in FIG. 1, which has the abovesaid advantages, is manufactured by a method including the following step for forming the non-single-crystal semiconductor layer 6P of the non-single-crystal semiconductor laminate member 5.

As described previously, the non-single-crystal semiconductor layer 6P is formed by the step in which the gas mixture M containing the semiconductor material gas G1, the recombination center neutralizer gas G2 and the P-type impurity material gas G3 is introduced into the reaction chamber 20 in which the insulating substrate 1 is positioned and the gas mixture M is made to undergo a chemical vapor reaction.

In this case, the insulating substrate 1 is disposed so that the top surface of the electrode 2 formed thereon may extend along the flow of the gas mixture M, and the chemical vapor reaction is carried out under the 0.1 to 10 Torr pressure and at 100° to 400° C. in the reaction chamber 20.

In this way, the non-single-crystal semiconductor lay 6P can be formed to have a small light absorption coefficient and high electric conductivity as described above. Since the non-single-crystal semiconductor layer 6P is formed at low temperatures ranging from 100° to 400° C., the recombination center neutralizer is not released from the layer 6P, providing it with sufficiently high electric conductivity.

By carrying out the aforementioned oxygen removing step prior to the formation of the non-single-crystal semiconductor layer 6P, its light transparency and conductivity can be further improved.

Accordingly, the manufacturing method of the present invention permits easy fabrication of the PIN type photoelectric conversion device which possesses the excellent features described above.

Next, a description will be given, with reference to FIG. 8, of a second embodiment of the PIN type photoelectric conversion device of the present invention.

Figure 8:
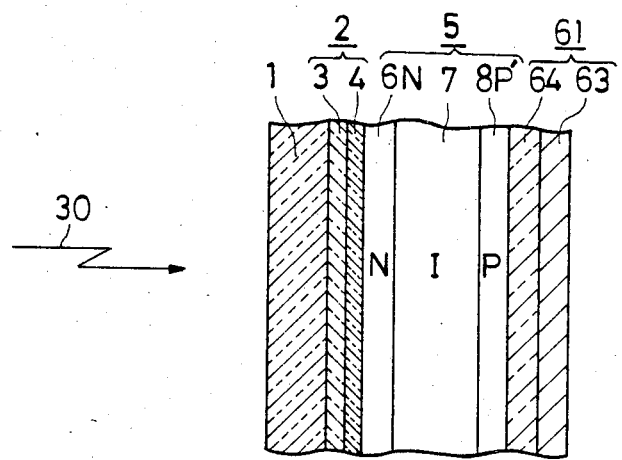
FIG. 8, 9 and 10 are sectional views schematically illustrating second, third and fourth embodiments of the PIN type semiconductor photoelectric conversion device of the present invention, respectively.

In FIG. 8, the parts corresponding to those in FIG. 1 are identified by the same reference numerals and no detailed description will be given.

The second embodiment of the present invention shown in FIG. 8 is identical in construction with the embodiment of FIG. 1 except the following points. The first P-type non-single-crystal semiconductor layer 6P in the embodiment of FIG. 1, which contains the recombination center neutralizer, has the fibrous and forms the non-single-crystal semiconductor layer 5, substituted with a non-single-crystal semiconductor layer 6N which similarly contains the recombination center neutralizer and has the fibrous structure but is N-type.

Such an N-type non-single-crystal semiconductor layer 6N can be formed by the same method as described previously in respect of FIGS. 4 and 5 for the formation of the non-single-crystal semiconductor layer 6P in the embodiment of FIG. 1. In this case, however, an N-type impurity material gas G4 is introduced from an N-type impurity material gas source 40 into the aforementioned reaction chamber 20 via a needle valve 50 instead of the P-type impurity material gas G3.

Besides, since the non-single-crystal semiconductor layer 6N is formed to contain an N-type impurity, there exists, between the flow quantity ratio $(Si_nH_m/H_2)$ of the silane $(S_nH_m)$ to the hydrogen $(H_2)$ and the output W of the high-frequency electric energy, such a lower limit region characteristic as indicated by the curve 45 (in the case of the oxygen removing step being not involved) or 47 (in the case of the oxygen removing step being involved) in FIG. 5 which is lower than the characteristic indicated by the curve 37 or 43. Accordingly, the flow quantity ratio $(Si_nH_m/H_2)$ between the selane $(Si_nH_m)$ and the hydrogen $(H_2)$ and the output W of the high-frequency electric energy are selected in a region 46 or 48 upwards of the curve 45 or 47.

The N-type non-single-crystal semiconductor layer 6N thus formed has also the same fibrous structure as described previously in respect of FIGS. 2 and 3 and has a small light absorption coefficient as described previously with regard to FIG. 6 for the P-type non-single-crystal semiconductor layer 6P in the embodiment of FIG. 1. Further, the layer 6N also is high in its electric conductivity as is the case with the layer 6P.

By the way, in the case where the N-type non-single-crystal semiconductor layer 6N was formed of silicon but contained hydrogen $(H_2)$ through using silane $(Si_nH_m)$ as the semiconductor material gas, phosphine $(PH_3)$ as the N-type impurity material gas G4 and hydrogen $(H_2)$ as the recombination center neutralizer, the relation of the electric conductivity C to the ratio (P/Si) between silicon (Si) and phosphorus (P) was such as indicated by the curve 80 in FIG. 7. In contrast thereto, in the cases where the non-single-crystal semiconductor layer 6N has the amorphous and microcrystalline structures, the electric conductivity C relative to the ratio (P/Si) is such as indicated by the curves 81 and 82 in FIG. 7.

The non-single-crystalline layer 8N' in the embodiment of FIG. 1 is substituted with a P-type non-single-crystal semiconductor layer 8P', which is also formed by the same manner as in the case of the non-single-crystal semiconductor layer 8N'.

Furthermore, the light transparent conductive layer 3 consisting of indium oxide or principally of the indium oxide and the light transparent conductive layer 4 consisting principally of the tin oxide, both of which made up the electrode 2, are exchanged in position in accordance with the substitution of the P-type non-single-crystal semiconductor layer 6P for the N-type one 6N, and the electrode 2 makes good ohmic contact with the N-tyep non-single-crystal semiconductor layer 6N through the light transparent conductive layer 4.

Moreover, the light transparent electrode 62, which is formed of a metal oxide consisting indium oxide or principally of the indium oxide and constitutes the electrode 61 in the embodiment of FIG. 1, is replaced with a light transparent conductive layer 64 formed of a metal oxide consisting of tin oxide or principally of tin oxide so as to obtain good ohmic contact with the P-type non-single-crystal semiconductor layer 8P'.

The above is the arrangement of the second embodiment of the present invention.

With such an arrangement, the second embodiment is identical in construction with the first embodiment of FIG. 1 except the abovesaid points, and hence possesses the same excellent features as those of the latter.

Figure 9:
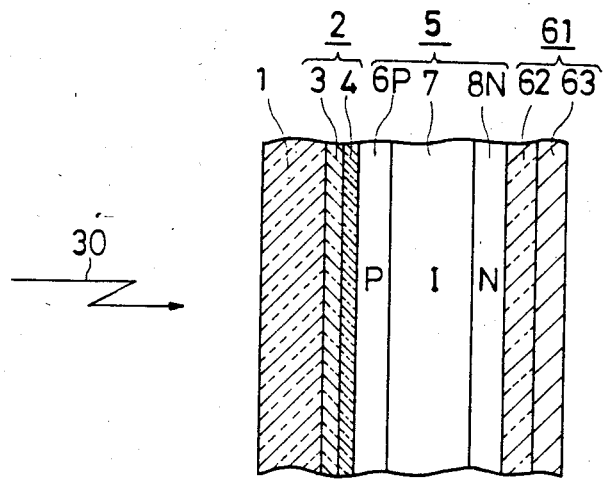

Turning next to FIG. 9, a third embodiment of the present invention will be described.

In FIG. 9, the parts corresponding to those in FIG. 1 are identified by the same reference numerals.

The third embodiment illustrated in FIG. 9 is also identical in construction with the first embodiment of FIG. 1 except the following point.

The N-type non-single-crystal semiconductor layer 8N' in the first embodiment of FIG. 1 is replaced with an N-type non-single-crystal semiconductor layer 8N which is opposite in conductivity type to the P-type non-single-crystal layer 6P but similarly contains the recombination center neutralizer and has the fibrous structure.

Such an N-type non-single-crystal semiconductor layer 8N is formed in the same manner as in the case of the N-type non-single-crystal semiconductor layer 6N described previously in respect of FIG. 8. Accordingly, the N-type layer 8N has a small light absorption coefficient and high electric conductivity as is the case with the P-type layer 6P.

The above is the third embodiment of the present invention.

With such an arrangement, the third embodiment is identical in construction with the first embodiment except the abovesaid point, and hence possesses the same excellent features as those of the latter.

Since the N-type non-single-crystal semiconductor layer 62, which is disposed on the opposite side from the side of incidence of the light 30 with respect to the I-type non-single-crystal semiconductor layer 7, has a small light absorption coefficient as is the case with the P-type non-single-crystal semiconductor layer 6P on the side on which the light 30 is incident, however, the N-type layer 62 inflicts only a small loss on light which is not absorbed by the I-type non-single-crystalline semiconductor layer 7 and passes through the non-single-crystal semiconductor layer 8N towards the electrode 61 and is then reflected by the electrode 61 back to the I-type non-single-crystal semiconductor layer 7. Furthermore, since the N-type non-single-crystal semiconductor layer 62 which makes ohmic contact with the electrode 61 has high electric conductivity as is the case with the P-type non-single-crystal semiconductor layer 6P which makes ohmic contact with the electrode 2, the carriers created in the I-type non-single-crystal semiconductor layer 7 can effectively be brought to the electrode 61.

Accordingly, it is possible with the third embodiment to obtain higher photoelectric conversion efficiency and response characteristic than in the first embodiment of FIG. 1.

Figure 10:
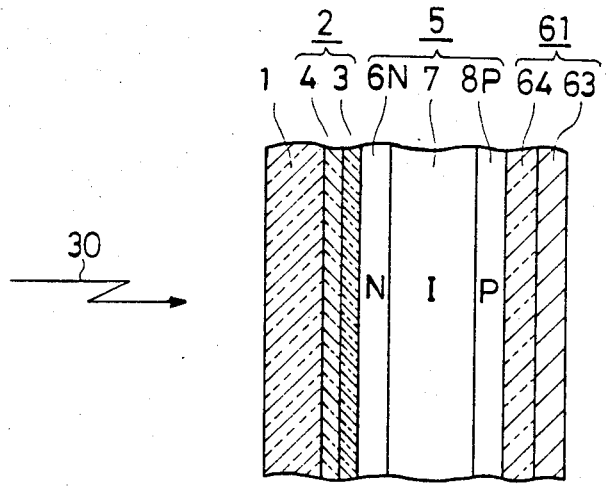

Referring next to FIG. 10, a fourth embodiment of the present invention will be described.

In FIG. 10 the parts corresponding to those in FIG. 8 are identified by the same reference numerals and no detailed description will be repeated.

The fourth embosiment of the present invention shown in FIG. 10 is identical in construction with the second embodiment of FIG. 8 except that the P-type non-single-crystal semiconductor layer 8P' in the latter is replaced with a P-type non-single-crystal semiconductor layer 8P which has the fibrous structure in common with the non-single-crystal semiconductor layer 8N described previously with regard to FIG. 9.

Accordingly, the fourth embodiment possesses the same excellent features obtainable with the third embodiment of FIG. 9, though not described in detail.

Figure 11:
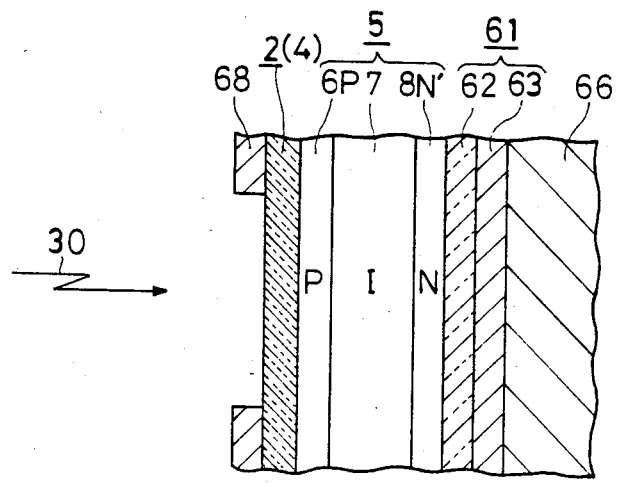
FIGS. 11, 12, 13 and 14 are sectional views schematically illustrating fifth, sixth seventh and eighth embodiments of the PIN type semiconductor photoelectric conversion device of the present inventions, respectively.

Turning next to FIG. 11, a fifth embodiment of the present invention will be described.

In FIG. 11 the parts corresponding to those in FIG. 1 are identified by the same reference numerals and no detailed description will be repeated. This embodiment is als identical in construction with the first embodiment of FIG. 1 except the following points.

In this fifth embodiment, the light transparent conductive layer 3 forming the electrode 2 in the first embodiment is left out and the light transparent insulating substrate 1 in the first embodiment is replaced with a substrate 66 as of ceramics, stainless steel or the like, on which a reflective conductive layer 63 forming the electrode 2, a light transparent conductive layer 62, the non-single-crystal semiconductor layers 8N', 7 and 6P forming the non-single-crystal laminate member 5 and the light transparent conductive layer 4 forming the electrode 2 are laminated in this order. In addition, a lead electrode 68 is connected to the light transparent conductive layer 4.

The above is a description of the fifth embodiment of the present invention.

With such an arrangement as described above, the fifth embodiment possesses the same features as those of the first embodiment, though not described in detail, since the former is idential with the latter except the abovesaid points.

Figure 12:
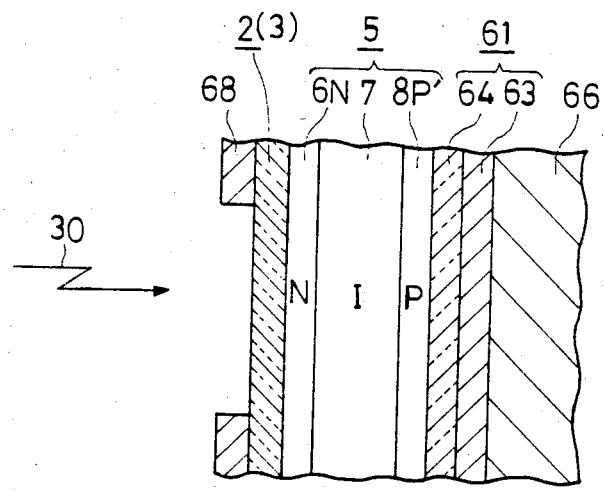

Referring next to FIG. 12, a sixth embodiment of the present invention will be described. In FIG. 12 the parts corresponding to those in FIG. 8 are identified by the same reference numerals.

In this embodiment, though not shown, the reflective conductive layer 63, the light transparent conductive layer 64, the non-single-crystal semiconductor layers 8P', 7 and 6N and the light transparent conductive layer 3 are laminated on the substrate 66 in this order and the lead electrode 68 is connected to the light transparent conductive layer 3 as in the case of the fifth embodiment described previously inconnection with FIG. 11.

It will be seen that the sixth embodiment provides the same features as described previously in respect of FIG. 8.

Figure 13:
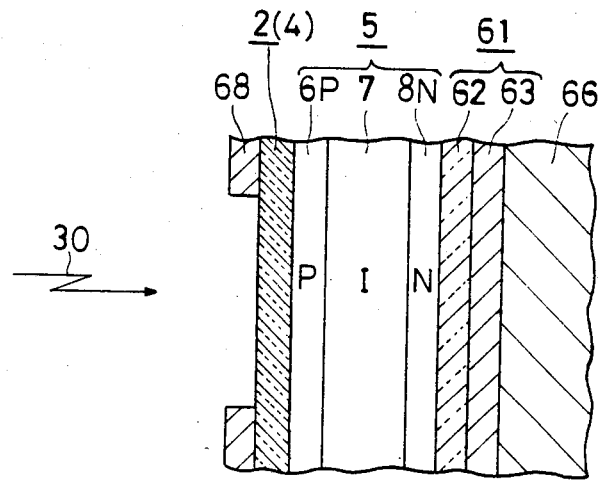

FIG. 13 illustrates a seventh embodiment of the present invention, in which the parts corresponding to those in FIG. 9 are identified by the same reference numaerals.

In this embodiment, though not described in detail, the reflective conductive layer 63, the light transparent conductive layer 62, the non-single-crystal semiconductor layers 8N, 7 and 6P and the light transparent conductive layer 4 are laminated in this order on the substrate 66 and the lead electrode 68 is deposited on the light transparent conductive layer 4 as in the fifth embodiment described previously with respect to FIG. 11.

It is evident that the seventh embodiment provides the same features as referred to previously in respect of FIG. 9.

Figure 14:
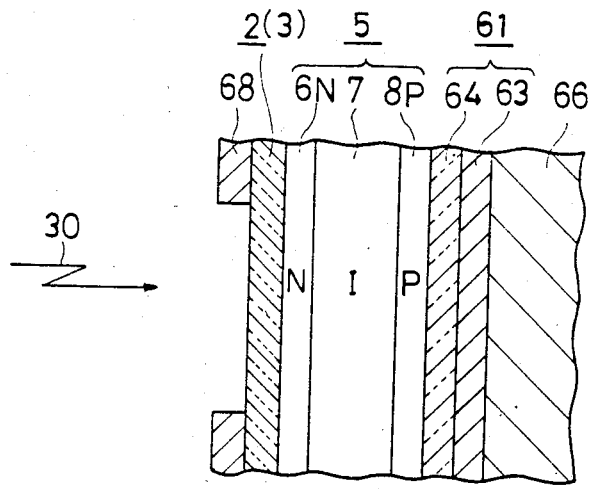

FIG. 14 illustrates an eighth embodiment of the present invention, in which the parts corresponding to those in FIG. 10 are identified by the same reference numerals.

In this embodiment, though not described in detail, the reflective conductive layer 63, the light transparent conductive layer 64, the non-single-crystal semiconductor layers 8P, 7 and 6N and the light transparent conductive layer 3 are laminated in this order on the substrate 66 and the lead electrode 68 is deposited on the light transparent conductive layer 3 as in the fifth embodiment described previously in respect of FIG. 11.

It is evident that the eighth embodiment provides the same features as mentioned previously in connection with FIG. 10.

Figure 15:
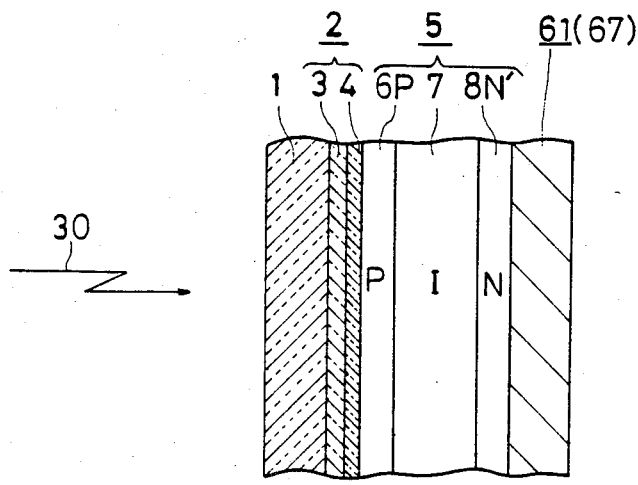
FIGS. 15 and 16 are sectional views schematically illustrating ninth and tenth embodiments of the PIN type semiconductor photoelectric conversion device of the present invention, respectively.
Figure 16:
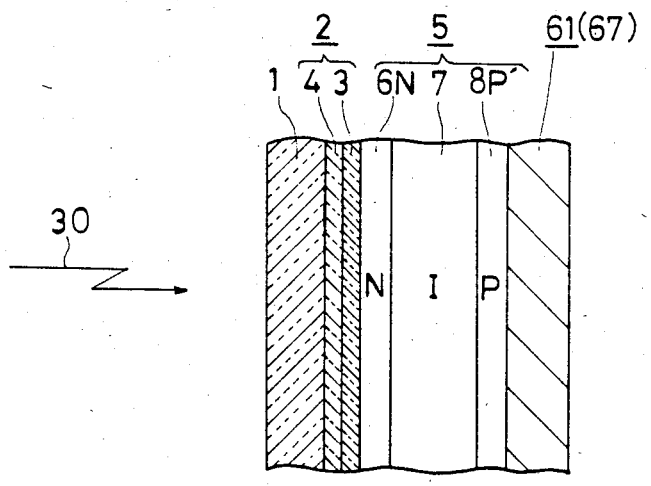

FIGS. 15 and 16 respectively illustrate ninth and tenth embodiments of the present invention, in which the parts corresponding to those in FIGS. 1 and 8, respectively are identified by the same references numerals. Those ninth and tenth embodiments, though not described in detail, are identical in construction with the embodiments of FIGS. 1 and 8, respectively, except that the second electrode 61 is formed by one conductive layer 67 as of aluminum.

Those ninth and tenth embodiments of such an arrangement also provide the same features as those of the first and second embodiments of FIGS. 1 and 8, respectively.

Figure 17:
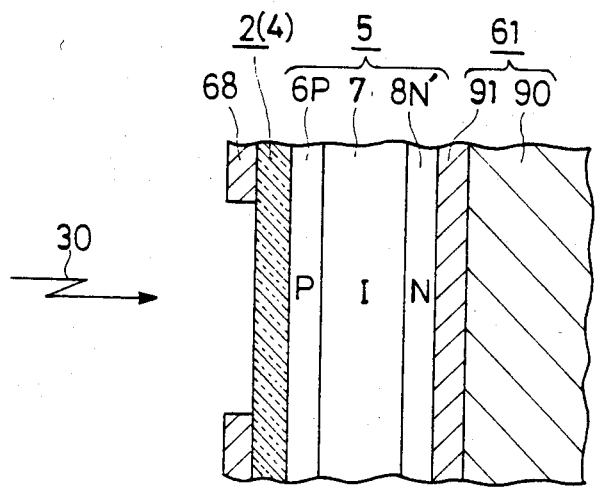
FIGS. 17 and 18 are sectional vews schematically illustrating eleventh and twelfth embodiments of the PIN type semiconductor photoelectric conversion device of the present invention, respectively.
Figure 18:
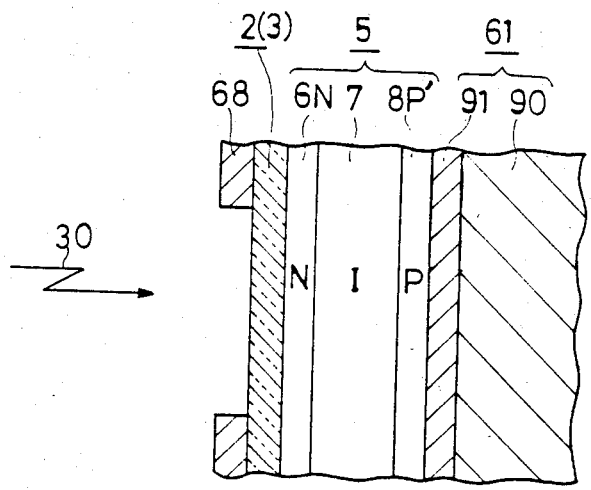

FIGS. 17 and 18 respectively illustrate eleventh and twelfth embodiments of the present invention, in which the parts corresponding to those in FIGS. 11 and 12, respectively, are identified by the same reference numerals. The eleventh and twelfth embodiments, though not described in detail, are identical in construction with the embodiments of FIGS. 11 and 12, respectively, except that the second electrode 61 is formed, for instance, by a nickel or like layer 91 plated on the substrate 90 as of stainless steel, iron or the like. Those embodiments of such an arrangement also provide the same features as those of the fifth and sixth embodiments of FIGS. 11 and 12, respectively.

It will be apparent that many modifications and variations may be effected without departing from the scope of the novel concepts of the present invention.

What is claimed is:

1. A PIN semiconductor photoelectric conversion device comprising:
  a laminated member including at least a first conductivity type non-single-crystal semiconductor layer forming a first major surface of the laminated member, an intrinsic non-single-crystal semiconductor layer, and a second conductivity non-single-crystal semiconductor layer forming a second major surface of the laminated member;
  a transparent electrode making ohmic contact with the first conductivity type non-single-crystal semiconductor layer through which light enters the laminated member; and
  a reflective electrode formed on the second conductivity type non-single-crystal semiconductor layer to make ohmic contact therewith;
  wherein the intrinsic non-single-crystal semiconductor layer has an amorphous structure; and
  wherein either one or both of the first and the second conductivity type non-single-crystal semiconductor layers has a fibrous structure.

2. A PIN semiconductor photoelectric conversion device according to claim 1, wherein crystals having the fibrous structure each has a (110) face and their <110> axes each extend along a line perpendicular to one of the major surfaces, or a line inclined at an angle of within ±30° to the perpendicular line.

3. A PIN semiconductor photoelectric conversion device according to claim 1, wherein the first and second conductivity type non-single-crystal semiconductor layers having the fibrous structure contain hydrogen or halogen as a recombination center neutralizer.

4. A PIN semiconductor photoelectric conversion device according to claim 1, wherein the first and second conductivity type non-single-crystal semiconductor layers and the intrinsic non-single-crystal semiconductor layer are formed of silicon or a semiconductor consisting principally of silicon.

5. A PIN semiconductor photoelectric conversion device according to claim 1, wherein the first conductivity type non-single-crystal semiconductor layer has a larger energy band gap than does the intrinsic non-single-crystal semiconductor layer.

6. A PIN semiconductor photoelectric conversion device according to claim 5, wherein the intrinsic non-single-crystal semiconductor layer is formed of silicon, and wherein the first conductivity type non-single-crystal semiconductor layer is formed of silicon carbide expressed by $Si_xC_{1-x}$ ($0<x<1$).

7. A PIN semiconductor photoelectric conversion device according to claim 1, wherein the reflective electrode comprises a light transparent conductive layer formed on the second conductivity type non-single-crystal semiconductor layer and a reflective conductive layer formed on the light transparent conductive layer.

8. A PIN semiconductor photoelectric conversion device according to claim 7, wherein the light transparent conductive layer of the reflective electrode is formed of a metal oxide, and wherein the reflective conductive layer is formed of metal.

9. A PIN semiconductor photoelectric conversion device according to claim 8, wherein the second conductivity type non-single-crystal semiconductor layer is N-type, and wherein the metal oxide forming the light transparent conductive layer of the reflective electrode is formed of a metal oxide consisting principally of indium oxide.

10. A PIN semiconductor photoelectric conversion device according to claim 9, wherein the reflective conductive layer of the reflective electrode is formed of aluminum or silver.

11. A PIN semiconductor photoelectric conversion device according to claim 8, wherein the second conductivity type non-single-crystal semiconductor layer is P-type, and wherein the metal oxide forming the light transparent conductive layer of the reflective electrode consists principally of tin oxide.

12. A PIN semiconductor photoelectric conversion device according to claim 11, wherein the reflective conductive layer of the reflective electrode is formed of aluminum or silver.

* * * * *